US010199092B2

(12) United States Patent
Chanana et al.

(10) Patent No.: US 10,199,092 B2
(45) Date of Patent: Feb. 5, 2019

(54) BOOST CIRCUIT FOR MEMORY

(71) Applicant: ARM Limited, Cambridge (GB)

(72) Inventors: Mohit Chanana, New Delhi (IN); Ankur Goel, Noida (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/188,873

(22) Filed: Jun. 21, 2016

(65) Prior Publication Data
US 2017/0365331 A1    Dec. 21, 2017

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC ..................................................... G11C 11/419
See application file for complete search history.

(56) References Cited

U.S. PATENT DOCUMENTS

| | | | | |
|---|---|---|---|---|
| 4,583,157 A * | 4/1986 | Kirsch | ...................... | G05F 1/62 327/306 |
| 5,504,711 A * | 4/1996 | Lu | ........................ | G11C 11/419 365/156 |
| 5,933,386 A * | 8/1999 | Walker | ................... | G11O 5/145 365/185.23 |
| 6,414,862 B1 * | 7/2002 | Ogura | ..................... | G11O 5/143 363/60 |
| 6,671,201 B2 * | 12/2003 | Masuda | .................... | G11C 7/12 365/154 |
| 7,800,959 B2 * | 9/2010 | Childs | .................... | G11O 5/145 365/189.08 |
| 8,363,453 B2 * | 1/2013 | Arsovski | .................. | G11C 7/12 365/154 |
| 8,411,518 B2 * | 4/2013 | Janardan | .................. | G11C 7/04 365/194 |
| 8,441,874 B2 * | 5/2013 | Sinha | ..................... | G11C 7/227 365/194 |
| 8,593,890 B2 * | 11/2013 | Adams | .................. | G11C 11/419 365/154 |
| 8,837,229 B1 * | 9/2014 | Dubey | .................. | G11C 11/417 365/189.02 |
| 8,976,607 B2 * | 3/2015 | Desai | .................... | G11C 7/1096 365/189.05 |

(Continued)

*Primary Examiner* — Anthan Tran
*Assistant Examiner* — Mushfique Siddique
(74) *Attorney, Agent, or Firm* — Pramudji Law Group PLLC; Ari Pramudji

(57) ABSTRACT

Various implementations described herein are directed to a device having a memory cell coupled to complementary bitlines. The memory cell may store at least one data bit value associated with complementary bitline signals received via the complementary bitlines. The device may include a pair of write drivers coupled to the memory cell via the complementary bitlines. The pair of write drivers may be arranged to provide the complementary bitline signals to the memory cell based on complementary boost signals. The device may include a pair of complementary boost generators coupled to corresponding gates of the pair of write drivers. The pair of complementary boost generators may be arranged to selectively provide the complementary boost signals to the corresponding gates of the pair of write drivers based on the at least one data bit value.

19 Claims, 4 Drawing Sheets

(56) References Cited

U.S. PATENT DOCUMENTS

| | | | |
|---|---|---|---|
| 9,030,893 B2* | 5/2015 | Jung | G11C 7/12 365/154 |
| 9,324,392 B1* | 4/2016 | Asenov | G11C 7/12 |
| 9,349,438 B2* | 5/2016 | Sano | G11C 7/12 |
| 9,401,201 B1* | 7/2016 | Jung | G11C 11/419 |
| 9,460,778 B2* | 10/2016 | Son | G11C 7/12 |
| 9,496,025 B2* | 11/2016 | Chandra | G11C 11/419 |
| 9,779,802 B1* | 10/2017 | Chang | G11C 11/419 |
| 2003/0031044 A1* | 2/2003 | Higeta | G11C 11/412 365/156 |
| 2009/0235171 A1* | 9/2009 | Adams | G11C 7/1096 715/723 |
| 2010/0182865 A1* | 7/2010 | Wu | G11O 5/145 365/226 |
| 2010/0188909 A1* | 7/2010 | Kenkare | G11C 11/419 365/189.16 |
| 2011/0149667 A1* | 6/2011 | Hamzaoglu | G11C 11/412 365/203 |
| 2011/0255361 A1* | 10/2011 | Russell | G11C 7/1075 365/230.05 |
| 2012/0140551 A1* | 6/2012 | Arsovski | G11C 7/12 365/154 |
| 2012/0163110 A1* | 6/2012 | Sinha | G11C 7/227 365/203 |
| 2012/0170391 A1* | 7/2012 | Janardan | G11C 7/04 365/194 |
| 2013/0286717 A1* | 10/2013 | Adams | G11C 11/419 365/154 |
| 2014/0003160 A1* | 1/2014 | Trivedi | G11C 7/12 365/189.02 |
| 2014/0112062 A1* | 4/2014 | Trivedi | G11C 11/419 365/154 |
| 2014/0169106 A1* | 6/2014 | Kolar | G11C 7/12 365/189.02 |
| 2014/0204687 A1* | 7/2014 | Sinangil | G11C 29/52 365/189.11 |
| 2014/0211546 A1* | 7/2014 | Jung | G11C 11/412 365/154 |
| 2014/0269112 A1* | 9/2014 | Jung | G11C 7/12 365/189.11 |
| 2015/0131364 A1* | 5/2015 | Hsieh | G11C 7/12 365/154 |
| 2015/0131368 A1* | 5/2015 | Adams | G11C 11/419 365/156 |
| 2015/0146479 A1* | 5/2015 | Pilo | G11C 11/419 365/156 |
| 2015/0279454 A1* | 10/2015 | Sano | G11C 7/12 365/189.09 |
| 2015/0371702 A1* | 12/2015 | Wu | G11C 11/419 365/156 |
| 2016/0042784 A1* | 2/2016 | Rim | G11C 11/419 365/154 |
| 2016/0093370 A1* | 3/2016 | Wu | G11C 11/419 365/154 |
| 2016/0203857 A1* | 7/2016 | Chandra | G11C 11/419 365/156 |
| 2016/0247557 A1* | 8/2016 | Jeong | G11C 11/413 |
| 2016/0247558 A1* | 8/2016 | Jeong | G11C 11/413 |

* cited by examiner

BOOST CIRCUIT FOR MEMORY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

The increasing demand of low power in applications, such as, e.g., IOT (Internet of Things), compels a need to operate SoC (System on a Chip) devices at substantially low voltages, while simultaneously ensuring time-correct read and write operations for memory, such as, e.g., SRAM (Static Random Access Memory). Generally, probability of a successful write may fall sharply with reduction in operational voltage. As such, in some cases, a minimum voltage at which SoC devices are operated may be limited (or bounded) by the periphery voltage of the memory (e.g., SRAM). In some cases, periphery voltage may be kept significantly lesser than core voltage to leverage power savings.

Although the inherent write-ability of bitcells may improve due to a higher core voltage, the bitcells may still have substantial design challenges. For instance, the write-ability of a bitcell for a given core voltage (Vddc) may fall sharply as the periphery voltage (Vddp) is reduced, e.g., due to reduced ground bounce. In some cases, WRM (Write Margin) variation with respect to periphery voltage may show that bitcell write ability degrades significantly as periphery voltage falls. In another instance, high split between core voltage (Vddc) and periphery voltage (Vddp) may result in reverse writes on bitlines, which may result in deteriorating the write margin, thereby limiting (or bounding) a minimum voltage at which periphery (and hence complete SOC) may be operated.

FIG. 1 illustrates conventional memory circuitry 100, which may be used as an example for a typical reverse write situation in memory (e.g., SRAM). For instance, a typical reverse write scenario is represented with core voltage Vddc at operation voltage (e.g., 0.8V) and periphery voltage Vddp near threshold operation voltage (e.g., 0.4V). In this scenario, a bitcell 102 may apply its pre-stored data on its complementary bitlines (BL, NBL) and pull bitline BL down to a substantially low level, depending on what polarity is stored in the bitcell versus what is being written through the write driver.

This scenario may produce a typical reverse write failure at the substantially low periphery voltage (e.g., Vddp=0.4V, when Vddc=0.8V). Due to a continuous fight from the bitcell 102, the bitline NBL on the falling side may get struck with a substantially high voltage (e.g., ~110 mV) before application of negative assist. As such, this substantially high voltage (e.g., ~110 mV) may be modelled as assist loss. Further, if the negative assist requirement from the bitcell 102 is, e.g., 40 mV at 0.8V core voltage, then an effective settling assist voltage of, e.g., 110 mV+40 mV=150 mV, may be needed. In some cases, the voltage at the other end of the bitline BL, which may be tightly held at ~0.4V (~Vddp level), may fall to about ~57 mV, due to a weaker PMOS M12 of write driver 2 (driven at Vddp), when compared to a series combination of M8, M6, and M2, which are being operated at Vddc level. This may result in a substantially low ground bounce being developed inside the bitcell and may increase an assist requirement further from ~150 mV to ~200 mV. Such assist voltage may be against an original bitcell requirement of 40 mV for write-ability. In this case, 200 mV may be difficult to achieve at 0.4V periphery voltage, while managing breakdown constraints on the higher side of the bitline BL voltage. The corresponding area impact will also will be significantly high.

Therefore, this conventional negative bitline assist scheme may not improve the above discussed limitations generally associated with reverse write situations when the Vddc versus Vddp split is high. In some cases, this effect may be worse at ultra-low periphery voltages, such as, e.g., below 0.4V.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to boost circuitry for memory applications. For instance, some implementations described herein refer to a dual boost scheme including, e.g., a dual boost reverse write suppress scheme and/or a dual boost write assist scheme. In some cases, these schemes may suppress reverse write issues that may be generally associated with low periphery voltages by providing an assist to the periphery circuit. As described herein, these schemes may overcome deficiencies of the conventional techniques by selectively applying negative and positive boosted voltages at the gate of write driver input depending on data to be written.

Various implementations of boost circuitry for memory applications will now be described in greater detail herein with reference to FIGS. 2-4.

Figure 1:
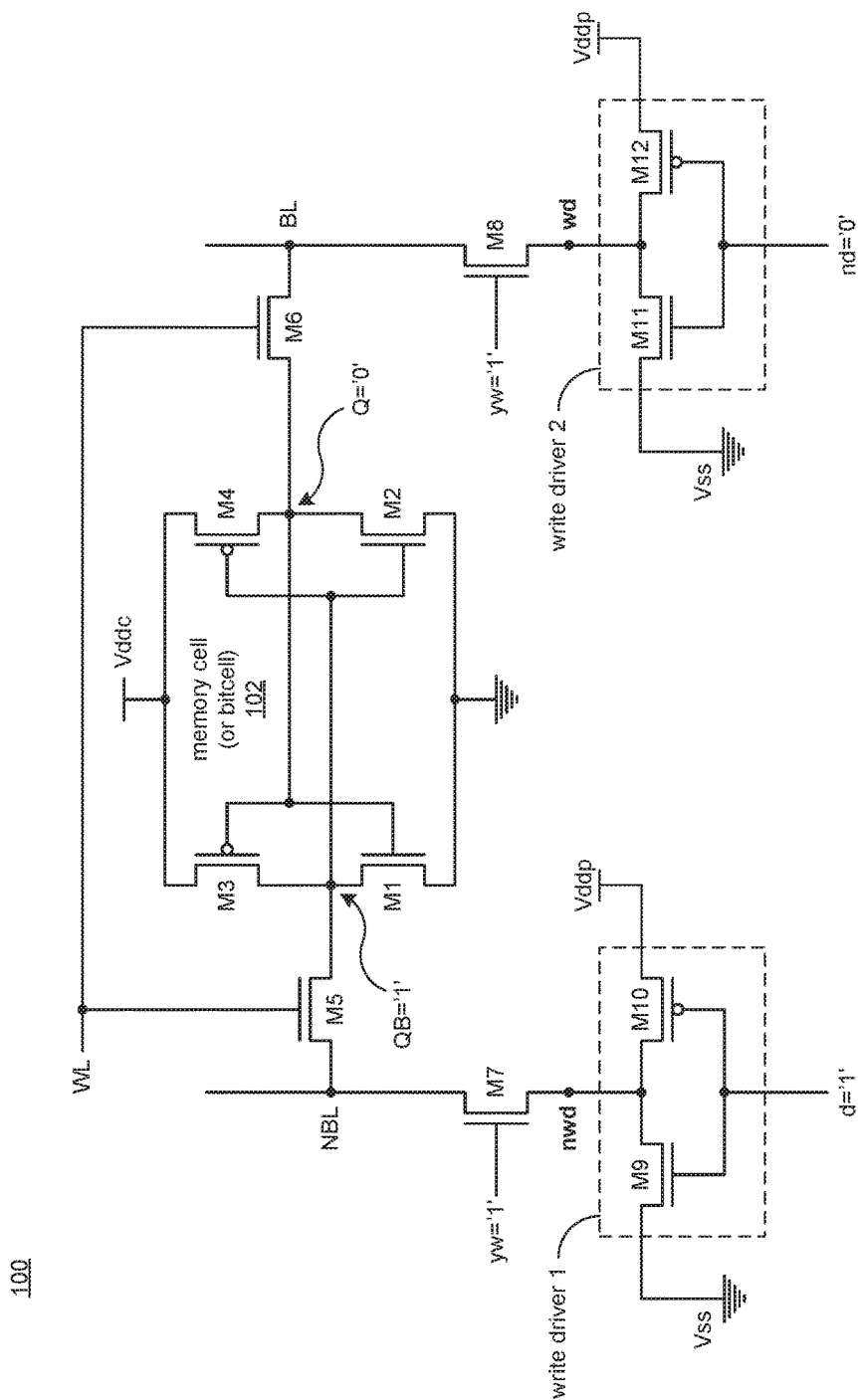
FIG. 1 illustrates conventional memory circuitry as known in the art.
Figure 2:
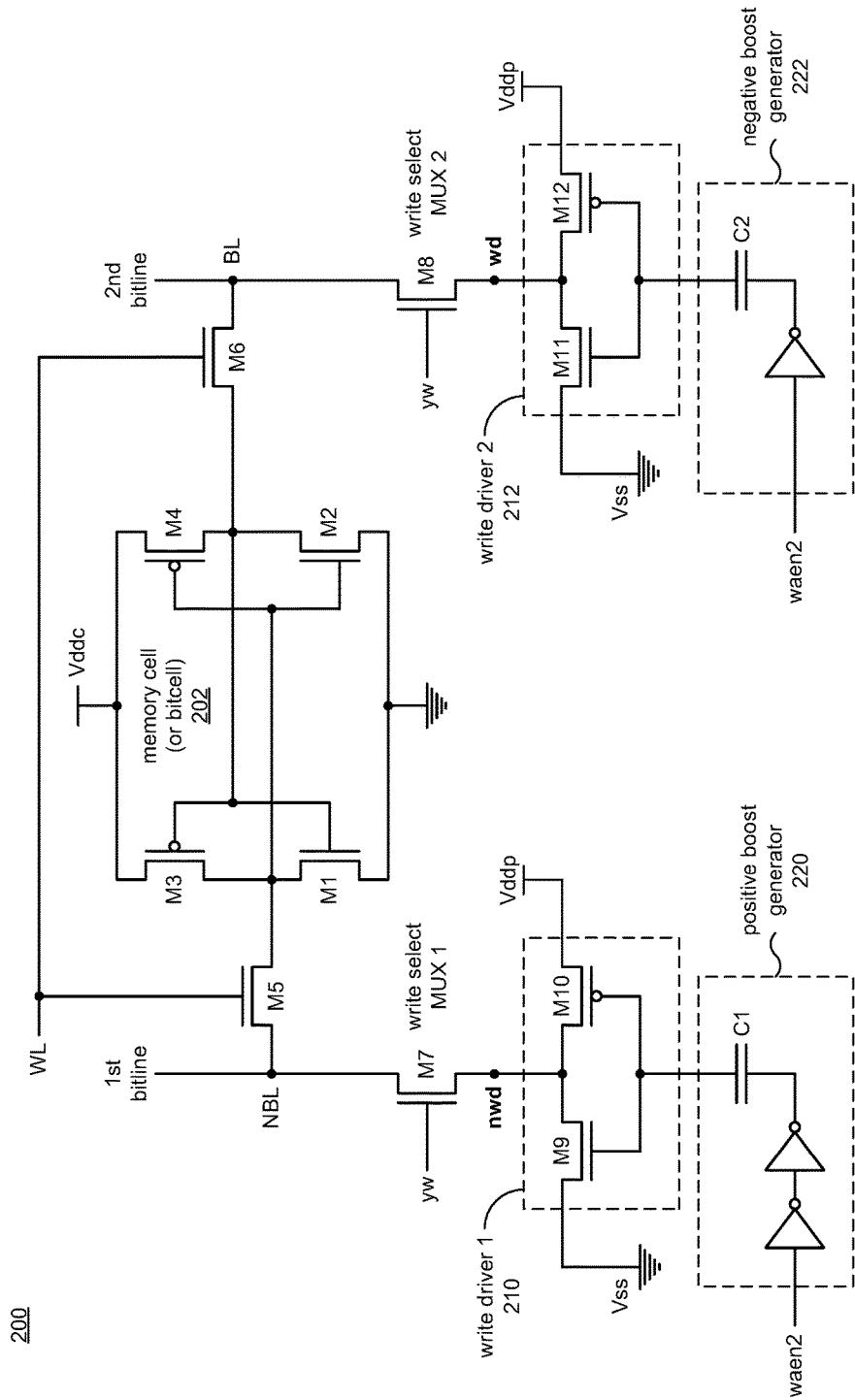
FIG. 2 illustrates a schematic diagram of a device having boost circuitry for memory applications in accordance with depicting one or more principles of various implementations described herein.

FIG. 2 illustrates a diagram of a device 200 having boost circuitry for memory applications in accordance with various implementations described herein.

In reference to FIG. 2, the device 200 may include a memory cell 202 coupled to complementary bitlines BL, NBL, wherein in this implementation, NBL refers to a first bitline NBL, and BL refers to a second bitline BL. In some cases, the memory cell 202 may be referred to as a bitcell. Generally, the memory cell 202 may be configured to store at least one data bit value (e.g., related to logic 0 or 1) associated with complementary bitline signals received via the complementary bitlines BL, NBL. In some implementations, the memory cell 202 may include a multi-transistor SRAM cell, including various types of SRAM cells, such as, e.g., a 6T CMOS SRAM (as shown) and/or other types of CMOS SRAM cells, such as, e.g., 4T, 8T, 10T or more transistors per bit.

The device 200 may include a pair of write drivers 210, 212 coupled to the memory cell 202 via the complementary bitlines BL, NBL. The pair of write drivers 210, 212 may be arranged to provide the complementary bitline signals to the memory cell 202 based on complementary boost signals. The pair of write drivers 210, 212 may include a first write driver 210 coupled to the memory cell 202 via the first bitline NBL, and the first write driver 210 may be arranged to provide a first complementary bitline signal to the memory cell 202 based on a first boost signal. Further, the pair of write drivers 210, 212 may include a second write driver 212 coupled to the memory cell 202 via the second bitline BL, and the second write driver 212 may be arranged to provide the second complementary bitline signal to the memory cell 202 based on a second boost signal.

In some implementations, each of the write drivers 210, 212 may be an inverter, such as, e.g., a CMOS (Complementary Metal-Oxide-Semiconductor) inverter having an N-type MOS (NMOS) transistor and a P-type MOS (PMOS) transistor. For instance, as shown in FIG. 2, a first write driver 210 (or first inverter) may include an NMOS transistor M9 and a PMOS transistor M10, and a second write driver 212 (or second inverter) may include another NMOS transistor M11 and another PMOS transistor M12.

The device 200 may include a pair of complementary boost generators 220, 222 coupled to corresponding gates of the pair of write drivers 210, 212. The pair of complementary boost generators 220, 222 may be arranged to selectively provide the complementary boost signals to the corresponding gates of the pair of write drivers 210, 212 based on polarity of the data to be written in a bitcell. In some cases, one of the boost generators 220 (such as a first boost generator 220) may be referred to as a positive boost generator, and another of the boost generators 222 (such as a second boost generator 222) may be referred to as a negative boost generator.

In some implementations, the first boost generator 220 (or positive boost generator 220) may be coupled to a gate or gates of the first write driver 210. The first boost generator 220 may be arranged to selectively provide the first boost signal to the gate or gates of the first write driver 210 based on the data bit value d or nd. Further, the second boost generator 222 (or negative boost generator 222) may be coupled to a gate or gates of the second write driver 212. The second boost generator 222 may be arranged to selectively provide the second boost signal to the gate or gates of the second write driver 222 based on the data bit value d or nd.

The device 200 may further include a pair of write select multiplexors M7, M8 coupled between the pair of write drivers 210, 212 and the memory cell 202 via the complementary bitlines BL, NBL. The pair of write select multiplexors M7, M8 are configured to provide the complementary bitline signals from the pair of write drivers 210, 212 to the memory cell 202 via the complementary bitlines BL, NBL upon activation.

In some implementations, the pair of write select multiplexors M7, M8 may include a first write select multiplexor M7 coupled between the first write driver 210 and the memory cell 202 via the first bitline NBL. The first write select multiplexor M7 may provide the first complementary bitline signal from the first write driver 210 to the memory cell 202 upon activation. Further, the pair of write select multiplexors M7, M8 may include a second write select multiplexor M8 coupled between the second write driver 212 and the memory cell 202 via the second bitline BL. The second write select multiplexor M8 may provide the second complementary bitline signal from the second write driver 212 to the memory cell 202 upon activation.

In some implementations, each of the pair of write select multiplexors M7, M8 may be implemented with an NMOS transistor. For instance, an NMOS transistor M7 may be coupled to the bitline NBL, and another NMOS transistor M8 may be coupled to the bitline BL. In some cases, each of the write select multiplexors M7, M8 may be controlled (or activated) by a write select multiplexor (MUX) signal yw.

The principle of operation is shown in FIG. 2, wherein two boost capacitors C1, C2 are provided with one capacitor each at the input of both write-lines (wd/nwd) drivers. For instance, the positive boost generator 220 may include at least one capacitor C1 coupled to the first write driver 210, and the negative boost generator 222 may include at least one other capacitor C2 coupled to the second write driver 212. As such, the pair of boost generators 220, 222 provide boosted voltages to the write drivers 210, 212, such as, e.g., at the gates of the transistors M9, M10, M11, M12. As will be described further herein, a circuit implementation for this configuration is provided in FIG. 3, wherein the two boost generators 220, 222 are provided for positive boost (pos_boost) and/or negative boost (neg_boost). The output nodes for the boost generators 220, 222 (pos_boost and neg_boost) may be selectively coupled to inputs of the write drivers (x_input1, x_input2) depending upon the data to be written, which may be controlled through the passgates (P3, N3 and P4, N4) that are driven by data nodes d, nd.

Figure 3:
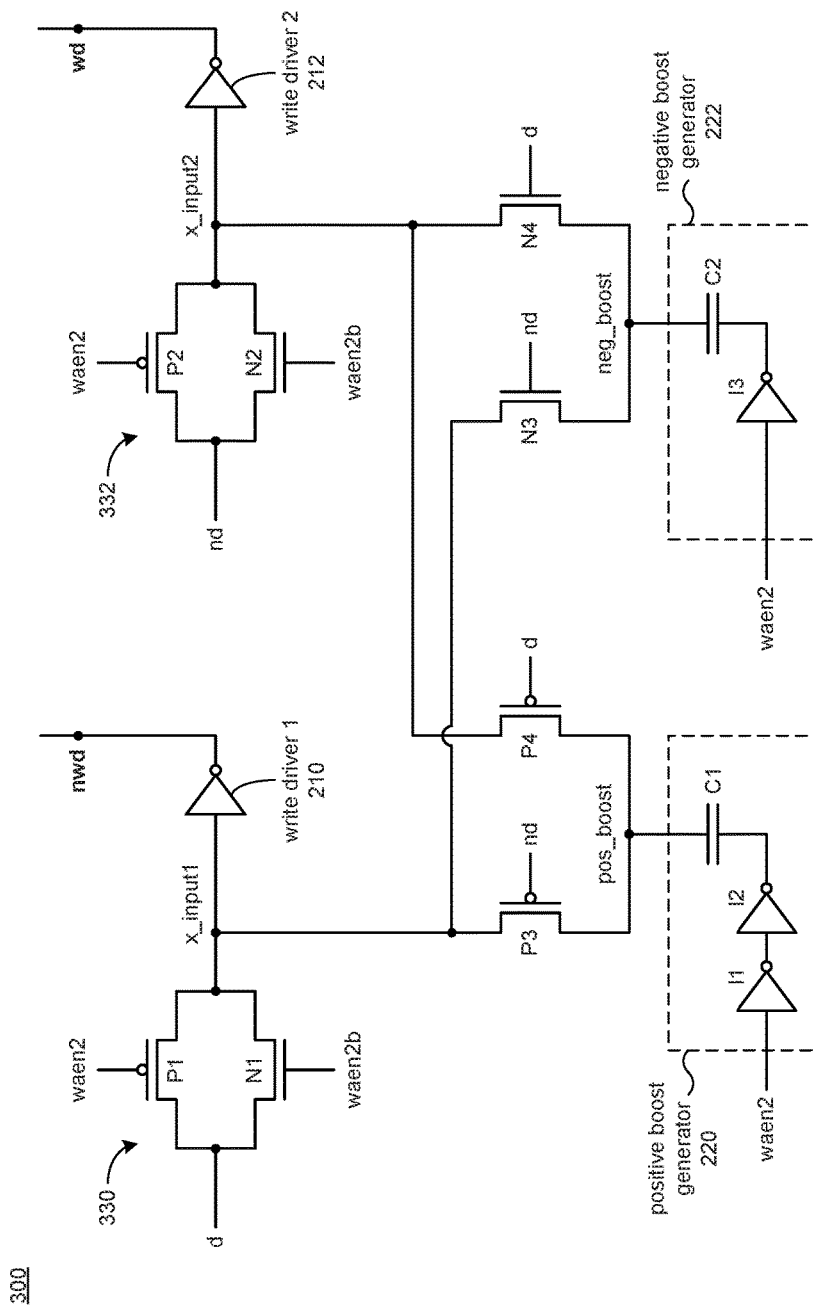
FIG. 3 illustrates another schematic diagram of boost circuitry for the device in accordance with various implementations described herein.

FIG. 3 illustrates another schematic diagram of boost circuitry 300 for the device 200 in accordance with various implementations described herein.

The boost circuitry 300 may include a complementary pair of transmission gates 330, 332 coupled to the pair of write drivers 210, 212, respectively. The complementary pair of transmission gates 330, 332 may pass the complementary data input signals d, nd to the pair of write drivers 210, 212 based on complementary write assist enable signals waen2, waen2b. In some implementations, the complementary pair of transmission gates 330, 332 may include a first pair of transmission gates 330 coupled to the first write driver 210, and the first pair of boost sharing passgates 330 may be configured to pass the first data input signal d to the first write driver 210 based on one or more write assist enable signals waen2, waen2b. Further, the complementary pair of transmission gates 330, 332 may include a second pair of transmission gates 332 coupled to the second write driver 212, and the second pair of boost sharing passgates 332 may be configured to pass a second data input signal nd to the second write driver 212 based on the one or more write assist enable signals waen2, waen2b.

In some implementations, each complementary pair of transmission gates 330, 332 may be implemented with PMOS and NMOS transistors. For instance, the first pair of transmission gates 330 may be implemented with a PMOS transistor P1 and an NMOS transistor N1, and the second pair of transmission gates 332 may be implemented with another PMOS transistor P2 and another NMOS transistor N2.

The boost circuitry 300 may include a pair of complementary boost sharing passgates P3, N3 and P4, N4 for each of the pair of write drivers 210, 212. As described herein, each write driver 210, 212 may be implemented as an inverter. As shown, each pair of complementary boost sharing passgates P3, N3 and P4, N4 may be controlled (or activated) by complementary data input signals d, nd. In some implementations, one pair (or a first pair) of complementary boost sharing passgates P3, N3 may be implemented with a PMOS transistor P3 and an NMOS transistor N3, and another pair (or second pair) of complementary boost sharing passgates P4, N4 may be implemented with another PMOS transistor P4 and another NMOS transistor N4.

As shown in FIG. 3, the first pair of complementary boost sharing passgates P3, N3 may be coupled between the pair of complementary boost generators 220, 222 (or first and second boost generators 220, 222) and one of the pair of write drivers 210 (or the first write driver 210). Further, the second pair of complementary boost sharing passgates P4, N4 may be coupled between the pair of complementary boost generators 220, 222 (or first and second boost generators 220, 222) and another of the pair of write drivers 212 (or the second write driver 212).

The pair of complementary boost generators 220, 222 may include the positive boost generator 220 having multiple inverters I1, I2 and at least one capacitor C1 arranged to receive the write assist enable signal waen2 and provide a positive boost signal pos_boost to one of the write drivers out of 210 and 212, which may depend upon the polarity of data to be written. The positive boost signal pos_boost may include a first boost signal of the pair of complementary boost signals. As such, the first boost generator 220 may be implemented as a positive boost generator having multiple inverters I1, I2 and a capacitor C1 arranged to receive the first write assist enable signal waen2 and provide the first boost signal pos_boost to one of the write drivers 210, 212, depending on polarity of data to be written, wherein the first boost signal pos_boost may be referred to as the positive boost signal.

The pair of complementary boost generators 220, 222 may include the negative boost generator 222 having at least one inverter I3 and at least one capacitor C2 arranged to receive the write assist enable signal waen2 and provide a negative boost signal neg_boost to one of the write drivers out of 210 and 212, which may depend upon the polarity of data to be written. The negative boost signal neg_boost may include a second boost signal of the pair of complementary boost signals. As such, the second boost generator 222 may be implemented as a negative boost generator having an inverter I3 and a capacitor C2 arranged to receive the first write assist enable signal waen2 and provide the second boost signal neg_boost to one of the write drivers 210, 212, depending on polarity of data to be written, wherein the second boost signal neg_boost may be referred to as a negative boost signal.

In some implementations, this circuit implementation of FIG. 3 provides two boost generators 220, 222 for supplying positive boost (pos_boost) and/or negative boost (neg_boost). Output nodes for the boost generators 220, 222 (pos_boost and neg_boost) may be selectively coupled to inputs of the write drivers (x_input1, x_input2) depending on the data to be written, which may be controlled through the pair of complementary boost sharing passgates P3, N3 and P4, N4 that are driven by data nodes d, nd.

For instance, in a first phase of operation, when the write assist enable signal waen2 is low (logic 0), the complementary pair of transmission gates 330, 332 are enabled and charges the write driver input nodes x_input1, x_input2 to a same level as data nodes d, nd. The output nodes neg_boost and pos_boost may be coupled to either input node x_input1 or input node x_input2 depending on a polarity of the data nodes d, n. Hence, the input node x_input1 and/or the input node x_input2 may be charged up to a desired voltage level, i.e., the neg_boost may be charged to logic 0, and/or the pos_boost may be charged to logic 1 or Vddp level.

Further, in a second phase of operation, once the node voltages have settled to a desired level, the write assist enable signal waen2 may rise from logic 0 (0V) to Vddp. This may be tracked with either local inverters (e.g., write drivers 210, 212) or global signals generated in control block (not shown). In some cases, this tacking may be used to turn OFF the transmission gates P1, N1 and/or P2, N2, thereby floating the write-drive inputs (x_input1, x_input2) and the output nodes of boost generators (neg_boost, pos_boost). In some cases, these floating nodes may be boosted to desired levels with boost capacitances triggered by rising of the write assist enable signal waen2.

In some implementations, the techniques and schemes provided herein may be used to assist with resolving problems related to reverse write by holding the bitlines strongly to a desired level. Hence, the periphery voltage (Vddp) may be held at or near threshold level without write failure. Further, relying on the application of boost voltage at the input of write drivers may be controlled by a locally routed node. Thus, a smaller sized boost capacitor may serve this purpose. Hence, the area overhead is not as large as the conventional negative bitline assist approach. Since the capacitor size is small, dynamic power consumption is less when compared to the conventional approach. In some cases, the boosted voltages at the gate of the write drivers may increase the drive strength of pull-down (e.g., pulling down the bitline to logic 0 or 0V), which may result in faster discharge of the bitline and improve write cycle time significantly.

In some implementations, during a write operation, the bitline on the falling side may not drop to logic 0 or 0V completely due to continuous fight from the bitcell, and the bitcell may stay or remain near 0V (e.g., ~40-50 mV) before the bitcell flip occurs. In this instance, WRM sigma may degrade significantly. The techniques and schemes provided herein may be used to assist with bringing the falling bitline more closely to logic 0 or 0V and provide a low area and dynamic power impact compared to the conventional approach. Further, the techniques and schemes provided herein may offer improved performance compared to the conventional approach due to faster discharge of the falling bitline. Therefore, techniques and schemes provided herein may serve as a low cost solution for slight requirements of write-assist, which may be useful when the bitcell is at least less than the target value requirements (e.g., 5.4 sigma).

Figure 4:
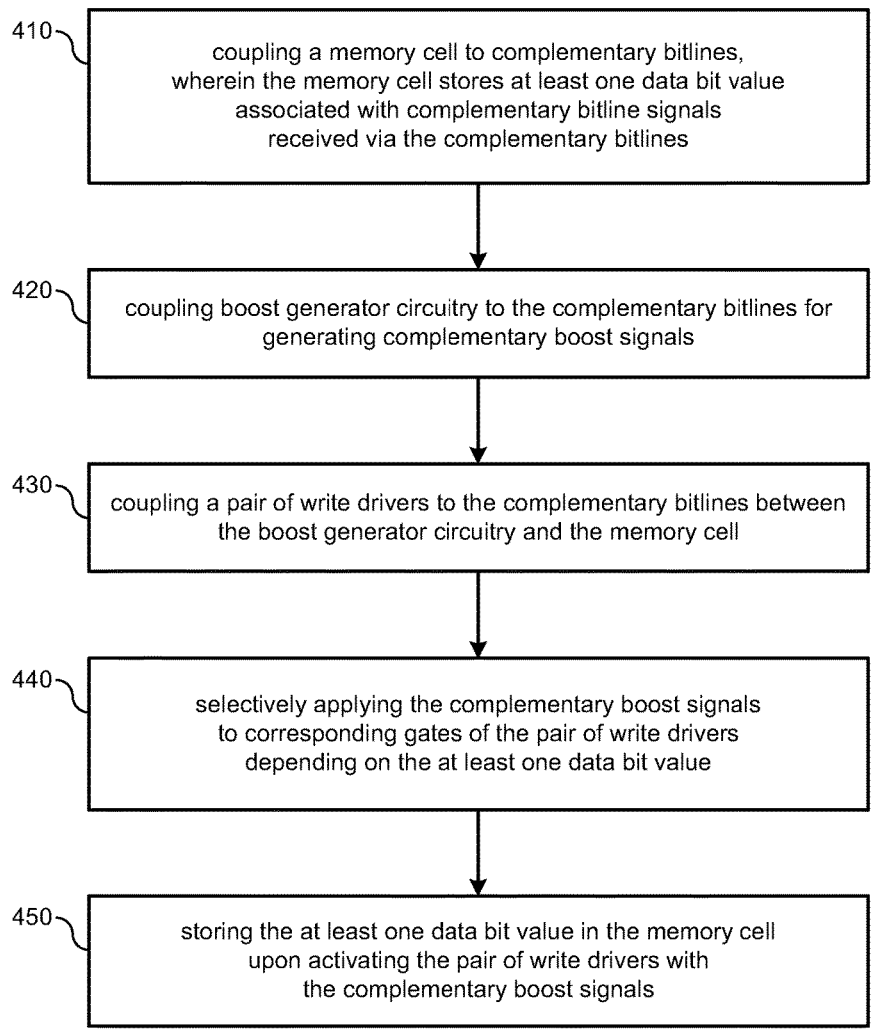
FIG. 4 illustrates a method for providing boost circuitry in accordance with various implementations described herein.

FIG. 4 illustrates a process flow of a method 400 for providing boost circuitry in accordance with various implementations described herein.

It should be understood that even though method 400 may indicate a particular order of execution of operations, in some instances, various certain portions of the operations may be executed in a different order, and on different systems. In some other instances, additional operations or steps may be added to and/or omitted from method 400. The method 400 may be implemented in hardware and/or software. If implemented in hardware, the method 400 may be implemented with various circuit components, such as described herein above in reference to FIGS. 2-3. If implemented in software, the method 400 may be implemented as a program or software instruction process that may be configured to provide boost circuitry as described herein. Further, if implemented in software, instructions related to implementing the method 400 may be stored in memory and/or a database. For instance, a computer or various other computing devices having a processor and memory may be configured to perform method 400.

In reference to FIG. 4, method 400 is configured to provide boost circuitry for memory applications. In some implementations, at block 410, method 400 may couple a memory cell to complementary bitlines. The memory cell may be configured to store at least one data bit value associated with complementary bitline signals received via the complementary bitlines. As described herein, the memory cell may include an SRAM cell such as, e.g., a multi-transistor SRAM cell.

At block 420, method 400 may couple boost generator circuitry to the complementary bitlines to generate complementary boost signals. The complementary boost signals may include a positive boost signal and a negative boost signal. The positive boost signal may be generated with a positive boost generator having multiple inverters and a capacitor arranged to receive a write enable signal and provide the positive boost signal to one of the pair of write drivers. The negative boost signal may be generated with a negative boost generator having an inverter and a capacitor arranged to receive the write enable signal and provide the negative boost signal to another one of the pair of write drivers.

At block 430, method 400 may couple a pair of write drivers to the complementary bitlines between the boost generator circuitry and the memory cell. At block 440, method 400 may selectively apply the complementary boost signals to corresponding gates of the pair of write drivers depending on the at least one data bit value. At block 450, method 400 may store the at least one data bit value in the memory cell upon activating the pair of write drivers with the complementary boost signals.

Described herein are various implementations of a device. The device may include a memory cell coupled to complementary bitlines. The memory cell may store at least one data bit value associated with complementary bitline signals received via the complementary bitlines. The device may include a pair of write drivers coupled to the memory cell via the complementary bitlines. The pair of write drivers may be arranged to provide the complementary bitline signals to the memory cell based on complementary boost signals. The device may include a pair of complementary boost generators coupled to corresponding gates of the pair of write drivers. The pair of complementary boost generators may be arranged to selectively provide the complementary boost signals to the corresponding gates of the pair of write drivers based on the at least one data bit value.

Described herein are various implementations of a device. The device may include a memory cell coupled to first and second bitlines. The memory cell may store a data bit value associated with first and second complementary bitline signals received via the first and second bitlines. The device may include a first write driver coupled to the memory cell via the first bitline. The first write driver may be arranged to provide the first complementary bitline signal to the memory cell based on a first boost signal. The device may include a second write driver coupled to the memory cell via the second bitline. The second write driver may be arranged to provide the second complementary bitline signal to the memory cell based on a second boost signal. The device may include a first boost generator coupled to a gate of the first write driver. The first boost generator may be arranged to selectively provide the first boost signal to the gate of the first write driver based on the data bit value. The device may include a second boost generator coupled to a gate of the second write driver. The second boost generator may be arranged to selectively provide the second boost signal to the gate of the second write driver based on the data bit value.

Described herein are various implementations of a method. The method may include coupling a memory cell to complementary bitlines, wherein the memory cell stores at least one data bit value associated with complementary bitline signals received via the complementary bitlines. The method may include coupling boost generator circuitry to the complementary bitlines for generating complementary boost signals. The method may include coupling a pair of write drivers to the complementary bitlines between the boost generator circuitry and the memory cell. The method may include selectively applying the complementary boost signals to corresponding gates of the pair of write drivers depending on the at least one data bit value. The method may include storing the at least one data bit value in the memory cell upon activating the pair of write drivers with the complementary boost signals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   a memory cell coupled to complementary bitlines, wherein the memory cell stores at least one data bit value associated with complementary bitline signals received via the complementary bitlines;
   a pair of write drivers coupled to the memory cell via the complementary bitlines, wherein each write driver includes a P-type transistor and an N-type transistor, wherein the pair of write drivers are arranged to provide the complementary bitline signals to the memory cell based on complementary boost signals;
   a pair of complementary boost sharing passgates for each of the pair of write drivers, wherein each pair of complementary boost sharing passgates include a P-type transistor and an N-type transistor that are controlled by complementary data input signals; and
   a pair of complementary boost generators coupled to inputs of the pair of write drivers via the pair of complementary boost sharing passgates for each of the pair of write drivers, wherein the inputs of the pair of write drivers are associated with corresponding gates of the P-type transistors and the N-type transistors of the pair of write drivers, wherein the pair of complementary boost generators are arranged to selectively provide the complementary boost signals directly to the corresponding gates of the P-type transistors and the N-type transistors of the pair of write drivers based on the at least one data bit value and its complementary data bit value.

2. The device of claim 1, further comprising a pair of write select multiplexors coupled between the pair of write drivers and the memory cell via the complementary bitlines, wherein the pair of write select multiplexors provide the complementary bitline signals from the pair of write drivers to the memory cell upon activation.

3. The device of claim 1, wherein one pair of complementary boost sharing passgates is coupled between the pair of complementary boost generators and one of the pair of write drivers, and wherein another pair of complementary boost sharing passgates is coupled between the pair of complementary boost generators and another of the pair of write drivers.

4. The device of claim 1, further comprising a complementary pair of transmission gates coupled to the pair of write drivers, wherein the complementary pair of transmission gates pass complementary data input signals to the pair of write drivers based on complementary write enable signals.

5. The device of claim 1, wherein the pair of complementary boost generators comprises a positive boost generator having multiple inverters and a capacitor arranged to receive a write enable signal and provide a positive boost signal to one of the pair of write drivers, and wherein the positive boost signal is a first boost signal of the pair of complementary boost signals.

6. The device of claim 1, wherein the pair of complementary boost generators comprises a negative boost generator having an inverter and a capacitor arranged to receive a write enable signal and provide a negative boost signal to another one of the pair of write drivers, and wherein the negative boost signal is a second boost signal of the pair of complementary boost signals.

7. The device of claim 1, wherein the memory cell comprises a multi-transistor static random access memory (SRAM) cell.

8. A device, comprising:
   a memory cell coupled to first and second bitlines, wherein the memory cell stores a data bit value associated with first and second complementary bitline signals received via the first and second bitlines;
   a first write driver coupled to the memory cell via the first bitline, wherein the first write driver includes a P-type transistor and an N-type transistor arranged as an inverter, wherein the first write driver is arranged to provide the first complementary bitline signal to the memory cell based on a first boost signal;
   a second write driver coupled to the memory cell via the second bitline, wherein the second write driver includes a P-type transistor and an N-type transistor, wherein the second write driver is arranged to provide the second complementary bitline signal to the memory cell based on a second boost signal;
   a first pair of boost sharing passgates coupled to an input of the first write driver, wherein the first pair of boost sharing passgates include a P-type transistor and an N-type transistor;
   a second pair of boost sharing passgates coupled to an input of the second write driver, wherein the second pair of boost sharing passgates include a P-type transistor and an N-type transistor;
   a first boost generator coupled to the input of the first write driver via the first pair of boost sharing passgates, wherein the input of the first write driver is associated with gates of the P-type transistor and the N-type transistor of the first write driver, wherein the first boost generator is arranged to selectively provide the first boost signal directly to the gates of the P-type transistor and the N-type transistor of the first write driver based on the data bit value and its complementary date bit value; and
   a second boost generator coupled to the input of the second write driver via the second pair of boost sharing passgates, wherein the input of the first write driver is associated with gates of the P-type transistor and the N-type transistor of the second write driver, wherein the second boost generator is arranged to selectively provide the second boost signal directly to the gates of the P-type transistor and an N-type transistor of the second write driver based on the data bit value and its complementary data bit value.

9. The device of claim 8, further comprising:
a first write select multiplexor coupled between the first write driver and the memory cell via the first bitline, wherein the first write select multiplexor provides the first complementary bitline signal from the first write driver to the memory cell upon activation; and
a second write select multiplexor coupled between the second write driver and the memory cell via the second bitline, wherein the second write select multiplexor provides the second complementary bitline signal from the second write driver to the memory cell upon activation.

10. The device of claim 8, wherein the first pair of boost sharing passgates are controlled by a first data input signal.

11. The device of claim 10, wherein the second pair of boost sharing passgates are controlled by a second data input signal that is complementary to the first data input signal.

12. The device of claim 8, comprising:
a first pair of transmission gates coupled to the first write driver,
wherein the first pair of transmission gates passes a first data input signal to the first write driver based on one or more write enable signals.

13. The device of claim 8, further comprising:
a second pair of transmission gates coupled to the second write driver,
wherein the second pair of transmission gates passes a second data input signal to the second write driver based on one or more write enable signals.

14. The device of claim 8, wherein the first boost generator comprises a positive boost generator having multiple inverters and a capacitor arranged to receive a first write enable signal and provide the first boost signal to the first write driver, and wherein the first boost signal comprises a positive boost signal.

15. The device of claim 8, wherein the second boost generator comprises a negative boost generator having an inverter and a capacitor arranged to receive a first write enable signal and provide the second boost signal to the second write driver, and wherein the second boost signal comprises a negative boost signal.

16. The device of claim 8, wherein the memory cell comprises a multi-transistor static random access memory (SRAM) cell.

17. A method, comprising:
coupling a memory cell to complementary bitlines, wherein the memory cell stores at least one data bit value associated with complementary bitline signals received via the complementary bitlines;
coupling boost generator circuitry to the complementary bitlines for generating complementary boost signals;
coupling a pair of write drivers to the complementary bitlines between the boost generator circuitry and the memory cell, wherein each write driver includes a P-type transistor and an N-type transistor;
coupling boost sharing passgates between the boost generator circuitry and the pair of write drivers, wherein the boost sharing passgates include P-type transistors and N-type transistors that are controlled by complementary data input signals;
selectively applying the complementary boost signals directly to inputs of the pair of write drivers that are associated with corresponding gates of the P-type transistors and N-type transistors of the pair of write drivers depending on the at least one data bit value and its complementary data bit value; and
storing the at least one data bit value in the memory cell upon activating the pair of write drivers with the complementary boost signals.

18. The method of claim 17, wherein:
the complementary boost signals comprise a positive boost signal and a negative boost signal,
the positive boost signal is generated with a positive boost generator having multiple inverters and a capacitor arranged to receive a write enable signal and provide the positive boost signal to one of the pair of write drivers, and
the negative boost signal is generated with a negative boost generator having an inverter and a capacitor arranged to receive the write enable signal and provide the negative boost signal to another one of the pair of write drivers.

19. The method of claim 17, wherein the memory cell comprises a multi-transistor static random access memory (SRAM) cell.

* * * * *